US006881088B2

(12) United States Patent  (10) Patent No.: US 6,881,088 B2
Gattuso et al.  (45) Date of Patent: Apr. 19, 2005

(54) CONNECTOR ASSEMBLY WITH ACTUATION SYSTEM

(75) Inventors: Andrew Gattuso, Phoenix, AZ (US); Sung Pei Hou, Tu-Chen (TW); Jung-Jang Chu, Tu-Chen (TW); Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 2 days.

(21) Appl. No.: 10/630,591

(22) Filed: Jul. 29, 2003

(65) Prior Publication Data

US 2005/0026491 A1  Feb. 3, 2005

(51) Int. Cl.[7] .............................................. H01R 4/50
(52) U.S. Cl. .................................... 439/342; 324/755
(58) Field of Search .......................... 439/331, 73, 330, 439/342, 259, 266; 257/727; 324/755, 765, 324/754, 760; 361/704–714

(56) References Cited

U.S. PATENT DOCUMENTS 5,186,642 A * 2/1993 Matsuoka et al. .......... 439/268
5,690,281 A   11/1997 Ikeya et al.
6,086,387 A * 7/2000 Gallagher et al. .......... 439/331
6,137,298 A * 10/2000 Binns ......................... 324/755
6,162,066 A * 12/2000 Glick et al. .................. 439/73
6,213,806 B1 * 4/2001 Choy ......................... 439/331
6,545,879 B1 * 4/2003 Goodwin .................... 361/785
6,741,089 B1 * 5/2004 Conroy ...................... 439/331

* cited by examiner

Primary Examiner—Briggitte R. Hammond
(74) Attorney, Agent, or Firm—Wei Te Chung

(57) ABSTRACT

A connector assembly (10) includes a test connector (14) for testing of an IC package (40), an actuation system (12) mounted on the test connector, and a supporting member (16) engaged with the actuation system. The supporting member includes a frame (162) and a plurality of columns (160) for supporting the frame. The frame defines an opening (1620) in a center thereof, a pair of opposite channels (1622), and two receiving holes (1623). The actuation system includes a pair of first cams (120) received in the corresponding channels of the frame, a pair of spindles (126) received in the corresponding receiving holes of the frame, an actuation lever (124) connected between the first cams, and a pair of second cams (122) integrally connected to the spindles. The actuation system can exert a continuous force on the test connector, thereby the testing of the IC package is effective.

30 Claims, 5 Drawing Sheets

CONNECTOR ASSEMBLY WITH ACTUATION SYSTEM

CROSS-REFERENCE TO RELATED APPLICATION

This present application is related to a co-pending U.S. patent application Ser. No. 10/455,921 filed on Jun. 6, 2003, entitled "SOCKET CONNECTOR WITH PIVOTING OPERATING MEMBERS," invented by two inventors among the inventors of the present application, and assigned to the same assignee as that of the present application.

BACKGROUND OF THE INVENTION

1. Field of the Invention

The present invention relates to a connector assembly, and particularly to a connector assembly with a test connector and an actuation system that exerts force on the test connector.

2. Description of Related Art

Burn-in sockets are widely used for receiving and testing of IC packages. A conventional burn-in socket includes a main body, a movable plate mounted on the main body, a plurality of operating levers for actuating lateral movement of the movable plate along the main body, and a lid. When the lid is moved downwardly to a lowest position by a robot or an operator's hand, the movable plate is slid to a released position. In the released position, the IC package is attached on the main body, although leads of the IC package are not electrically engaged with electrical terminals of the main body. When the lid is moved to a highest position, the movable plate is slid to a contacting position, in which the leads of the IC package are electrically engaged with the terminals. U.S. Pat. Nos. 5,186,642 and 5,690,281 disclose this kind of burn-in socket. However, in use, if a downward force exerted on the lid is insufficient or inappropriate, the leads of the IC package and the terminals of the main body are liable to sustain damage when the IC package is attached on the main body.

Co-pending U.S. patent application Ser. No. 10/455,921 shows another kind of burn-in socket. Referring to FIG. 5, the burn-in socket 90 comprises a base 901, a cover 902, a pair of operating members 903, four coil springs 904, and a lid 905. A plurality of electrical terminals (not shown) is received in the base 901. The cover 902 is slidably mounted on the base 901, and defines a plurality of passages (not labeled) in vertical alignment with the corresponding terminals of the base 901. The coil springs 904 are located around a periphery of the base 901 to provide force for sliding the cover from an open position to a closed position. The operating members 903 are respectively positioned on a middle portion of each of opposite sides (not labeled) of the base 901, between the lid 905 and the cover 902. The operating members 903 convert vertical movement of the lid 905 into horizontal movement of the cover 902 relative to the base 901.

In use, the burn-in socket 90 is first put into a testing state. The lid 905 is located in a highest position. The cover 902 is disposed in an open position, thereby allowing free insertion or withdrawal of an IC package (not shown) into or from the base 901, respectively. That is, leads of the IC package do not contact the terminals. Then, a robot or an operator's hand (not shown) applies force on the lid 905. The lid 905 is moved downwardly to a lowest position, with corresponding force being applied to the operating members 903. The operating members 903 drive the cover 902 to move horizontally from the open position to the closed position, in which the leads of the IC package mechanically and electrically engage with the terminals.

In the burn-in socket 90, if the force applied on the lid 905 is exerted by an operator's hand, the force is liable to be discontinuous. If this occurs, testing of the IC package may be intermittent or disrupted, or may even fail altogether. If the force applied on the lid 905 is exerted by a robot, the robot itself takes up extra space in the testing environment. This can be inconvenient, and is liable to directly or indirectly increase the cost of testing IC packages.

A new connector assembly that overcomes the above-mentioned problems is desired.

SUMMARY OF THE INVENTION

An object of the present invention is to provide a connector assembly having an actuation system which can exert continuous force on a test connector of the connector assembly.

In order to achieve the above object, a connector assembly in accordance with a preferred embodiment of the present invention comprises a test connector mounted on the a PCB module, a supporting member mounted on the PCB module, and an actuation system engaged with the supporting member. The test connector comprises a base with a plurality of terminals therein, a cover movably mounted on the base, a lid engaged with the base, and a pair of operating members engaged with the base and the cover. The supporting member comprises a frame and a plurality of columns for supporting the frame. The frame defines an opening in a center thereof, and a pair of opposite channels next to the opening, a pair of receiving holes formed in inner lateral sidewalls thereof at opposite sides of the opening in communication with the corresponding channels. The actuation system comprises a pair of first cams received in the corresponding channels of the frame, a pair of spindles received in the receiving holes of the frame, an actuation lever connected between the first cams, and a pair of second cams integrally connected to the corresponding spindles. When the actuation system is oriented at a first position, the lid is located in a highest position with the cover in an open position in which the leads of the IC package do not contact the terminals in the base of the test connector, while when the actuation system is rotated to a second position, the lid is moved downwardly to a lowest position with the cover being moved to a closed position in which the IC package is mechanically and electrically connected to the terminals in the base.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the invention in detail.

The present invention will be described in its preferred embodiment in conjunction with a heat sink, a pressing member, a printed circuit board (PCB) module, an integrated circuit (IC) package, and a supporting plate.

Figure 1:
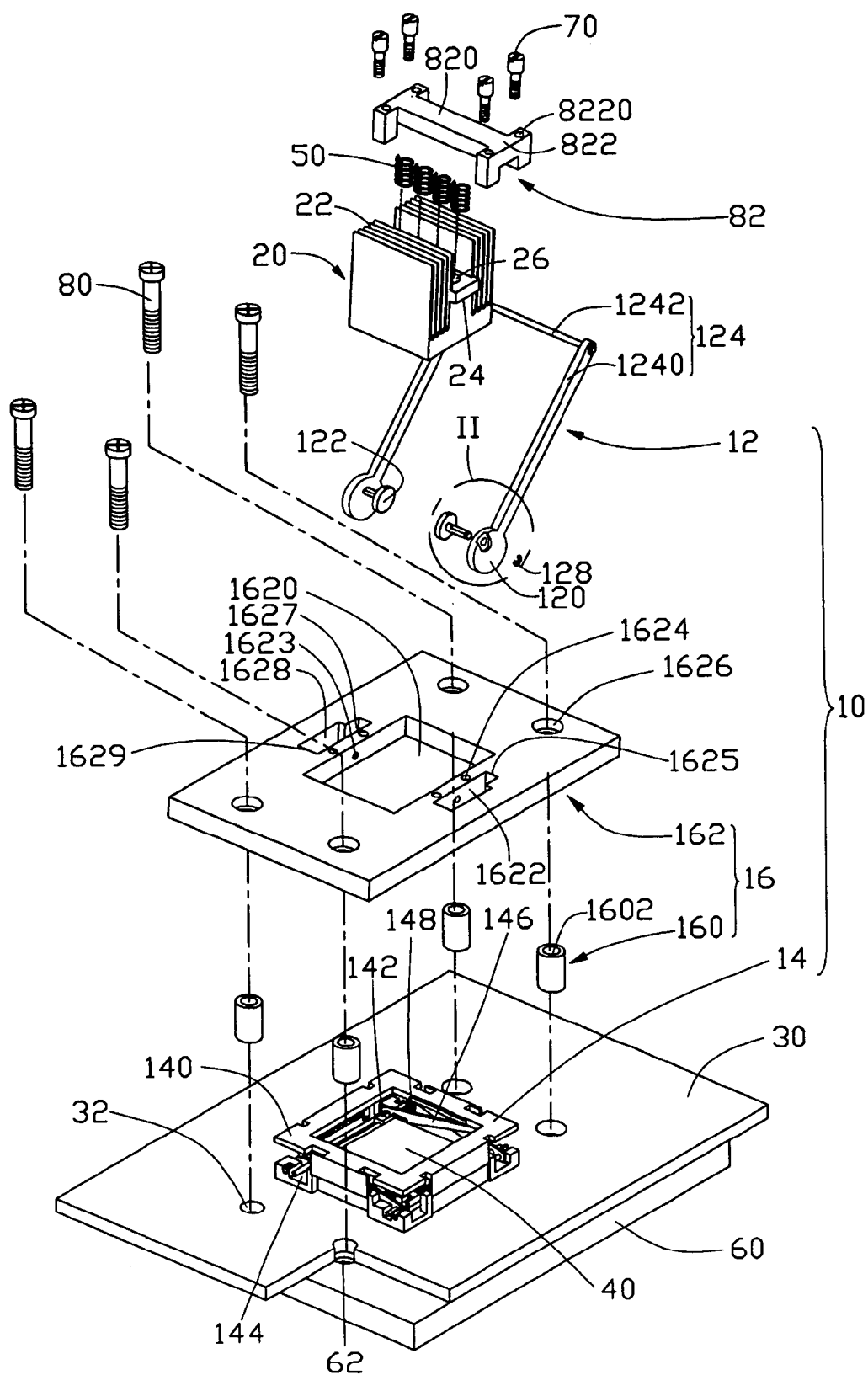
FIG. 1 is a simplified, exploded isometric view of a connector assembly in accordance with the preferred embodiment of the present invention, together with an IC package received in a test connector of the connector assembly, a PCB module, a supporting plate, a heat sink, and a pressing member.

FIG. 1 shows a connector assembly 10 of the present invention, together with a heat sink 20, a pressing member 82, a PCB module 30, an IC package 40, and a supporting plate 60. The connector assembly 10 comprises an actuation system 12, a test connector 14, and a supporting member 16.

The heat sink 20 comprises a plurality of fins 22, and a connection portion 24 formed in a center of the plurality of fins 22. The connection portion 24 defines four aligned blind holes 26. The PCB module 30 is mounted on the supporting plate 60, and defines four mounting holes 32 in a rectangular formation. The supporting plate 60 is used for supporting and protecting the PCB module 30. Four first threaded holes 62 are defined in the supporting plate 60, corresponding to the mounting holes 32 of the PCB module 30.

The pressing member 82 is mounted on the supporting member 16. The pressing member 82 is generally "I"-shaped, and comprises a pair of end portions 822 and a middle portion 820 interconnecting the end portions 822. Each end portion 822 defines a pair of spaced second through holes 8220. Four blind holes (not shown) are defined in a bottom of the pressing member 82, corresponding to the blind holes 26 of the heat sink 20. Four coil springs 50 are respectively received between the blind holes of the pressing member 82 and the blind holes 26 of the heat sink 20. Four fasteners such as bolts 70 are used for mounting the pressing member 82 on the supporting member 16.

The test connector 14 comprises a lid 140, a cover 142, a base 144, a pair of operating members 146, and four coil springs 148 located between the base 144 and the lid 140. A plurality of electrical terminals (not shown) is received in the base 144. The lid 140 is located on the cover 142, and can move perpendicularly relative to the base 144. The operating members 146 are respectively engaged with the base 144 and the cover 142, and can convert vertical movement of the lid 140 to horizontal movement of the cover 142 relative to the base 144. When no force is exerted on the lid 140, the lid 140 is located in a highest position. In this position, the cover 142 is in an open position. In the open position, the IC package 40 can be freely inserted into or withdrawn from the base 144. That is, leads (not shown) of the IC package 40 do not contact the terminals of the base 144. Insertion and withdrawal of the IC package 40 is accomplished with so-called zero force. When external force is applied on the lid 140, it is pushed down to a lowest position. The operating members 146 actuate the cover 142 to slide horizontally along the base 144 to a closed position. In the closed position, the leads of the IC package 40 are mechanically and electrically connected to the terminals of the base 144.

Figure 2:
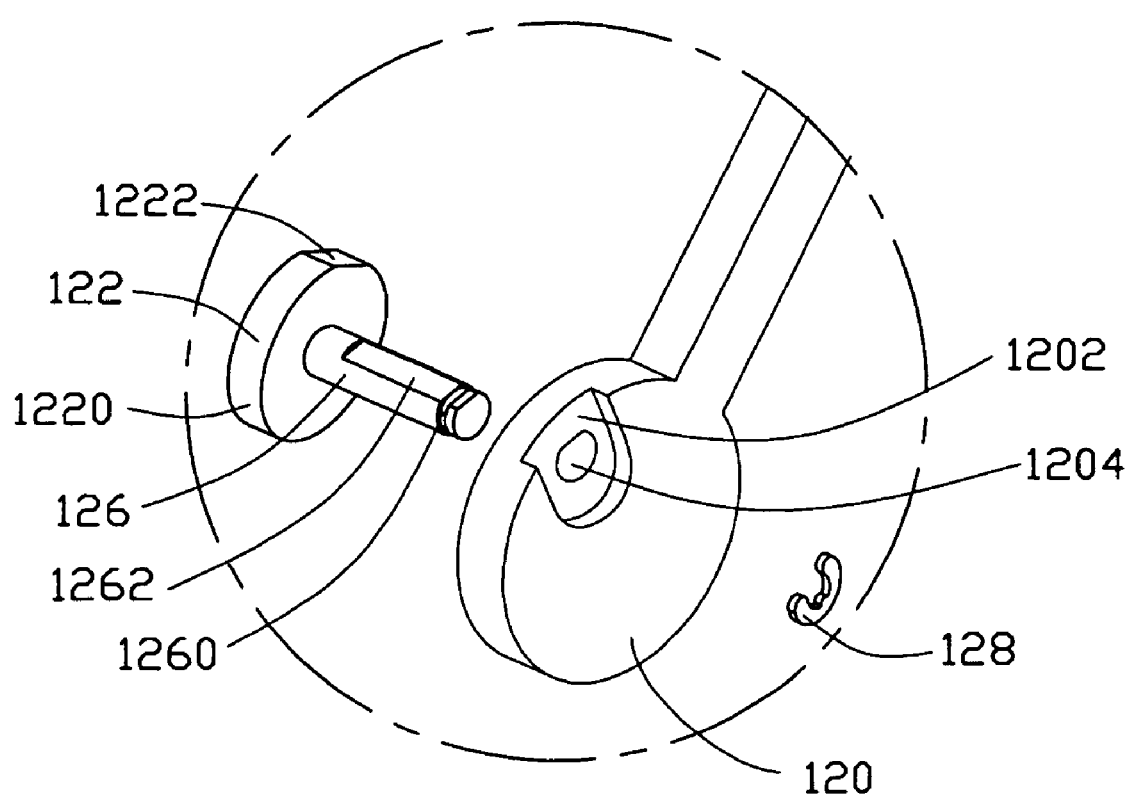
FIG. 2 is an enlarged view of a circled portion II of FIG. 1.

Referring also to FIG. 2, the actuation system 12 is engaged with the supporting member 16, and can exert force on the lid 140 of the test connector 14. The actuation system 12 comprises a pair of large first cams 120, a pair of small second cams 122, an actuation lever 124, and a pair of spindles 126. The actuation lever 124 comprises a pair of first lever arms 1240, and a second lever arm 1242 interconnecting the first lever arms 1240. Each first lever arm 1240 and its corresponding first cam 120 are integrally formed as a single piece. A width of the first lever arm 1240 is equal to a width of the first cam 120. The first cam 120 is generally circular. A "D"-shaped recessed portion 1202 is defined in a peripheral part of the first cam 120 near the first lever arm 1240. The recessed portion 1202 is spaced from a central part of the first cam 120. An axle hole 1204 is defined in a center of the recessed portion 1202, for receiving the corresponding spindle 126. In the preferred embodiment of the presented invention, each spindle 126 is integrally formed with its corresponding second cam 122 as a single piece. Alternatively, each spindle 126 and its corresponding second cam 122 can be separate parts. A cross-section of each second cam 122 is generally "D"-shaped. That is, a peripheral part of the second cam 122 comprises a circular portion 1220 and a planar portion 1222. A circumferential length of the circular portion 1220 is greater than that of the planar portion 1222. A distance from a central axis of the spindle 126 to any part of an edge of the circular portion 1220 is greater than a distance from the axis of the spindle 126 to any part of an edge of the planar portion 1222. The spindle 126 comprises a planar portion 1262 formed along a circumferential periphery thereof. An annulus groove 1260 is defined in a distal end of the spindle 126. A "C"-shaped flexible washer 128 is retained in the annulus groove 1260 of the spindle 126, for preventing the corresponding first cam 120 from disengaging from the spindle 126.

The supporting member 16 is mounted on the PCB module 30, and comprises a frame 162 and four columns 160 for supporting the frame 162. Each column 160 defines a first through hole 1602 in a center thereof. The frame 162 defines an opening 1620 in a center thereof, and a pair of parallel channels 1622 at opposite lateral sides of the frame 162 respectively next to the opening 1620. The heat sink 20 is inserted and removed through the opening 1620 of the frame 162. Each channel 1622 comprises a long, broad portion 1628, and a short, narrow portion 1627. A width of the narrow portion 1627 is slightly wider than the width of a corresponding first cam 122 of the actuation system 12. The narrow portion 1627 defines a first end 1625, and the broad portion 1628 defines an opposite second end 1629. A pair of receiving holes 1623 is defined in inner lateral sidewalls of the frame 162 at opposite sides of the opening 1620 respectively. The receiving holes 1623 are in communication with the respective channels 1622. A pair of second threaded holes 1624 is defined in each of connection walls (not labeled) that are between the opening 1620 and the respective channels 1622. The second threaded holes 1624 correspond to the second through holes 8220 of the pressing member 82. Four stepped holes 1626 are defined in the frame 162 in a rectangular formation, the stepped holes 1626 corresponding to the mounting holes 32 of the PCB module 30. Four fasteners such as screws 80 are used for fastening the frame 162 and the columns 160 on the PCB module 30.

Figure 3:
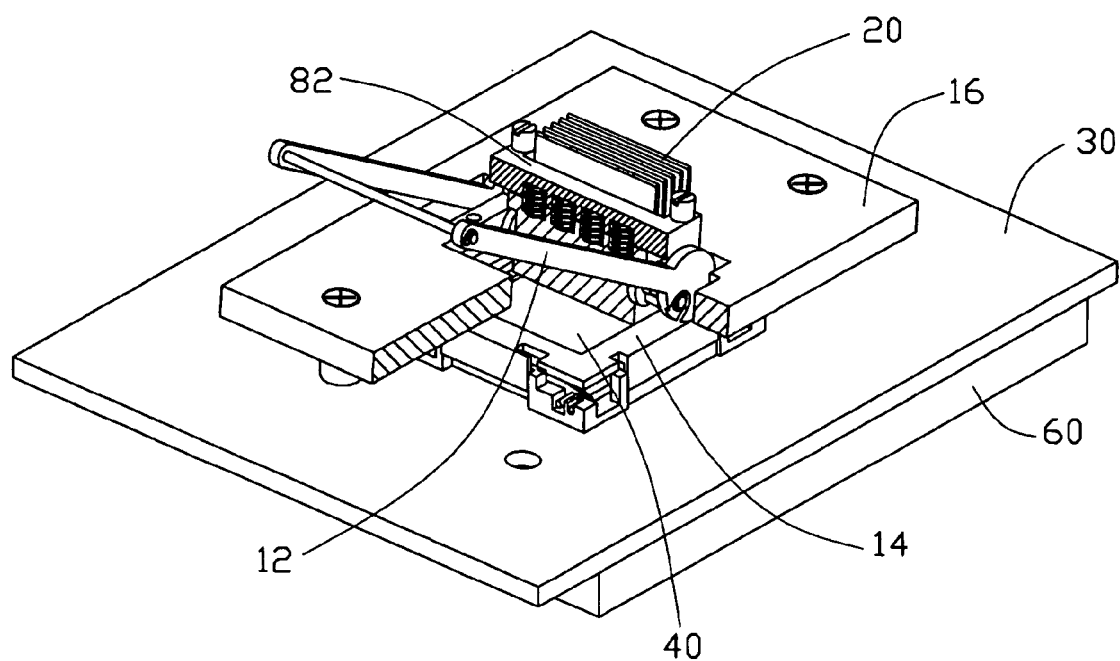
FIG. 3 is a partly cut-away view of the components of FIG. 1 assembled together, showing an actuation system and the test connector of the connector assembly of FIG. 1 in respective first positions.
Figure 4:
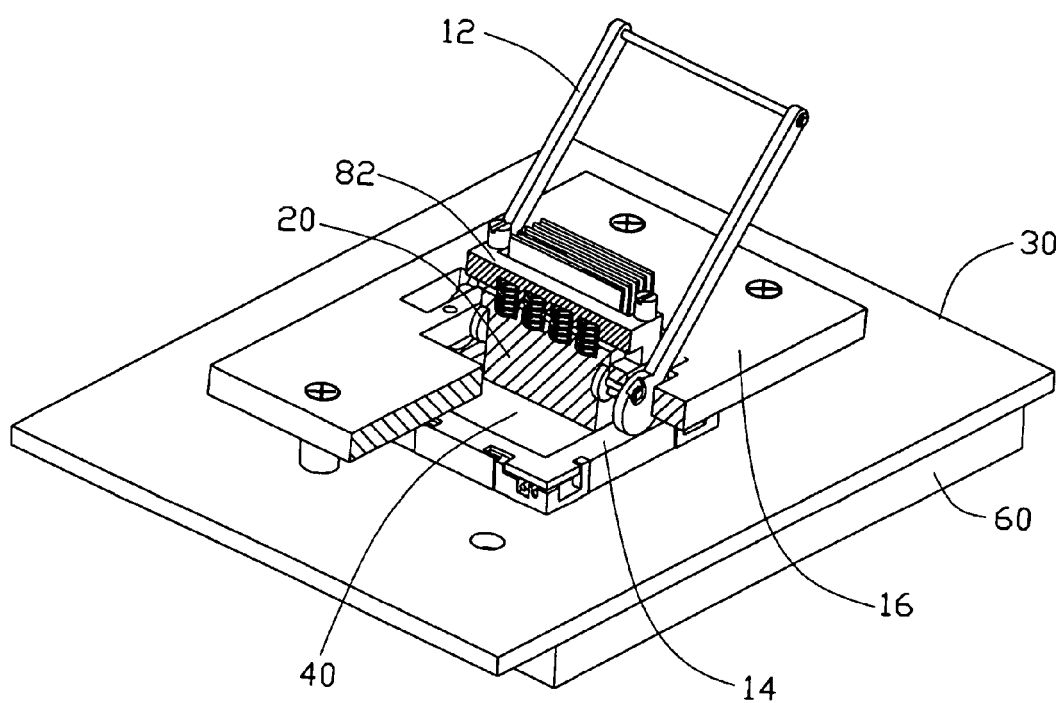
FIG. 4 is similar to FIG. 3, but showing the actuation system and the test connector of the connector assembly of FIG. 1 in respective second positions.
Figure 5:
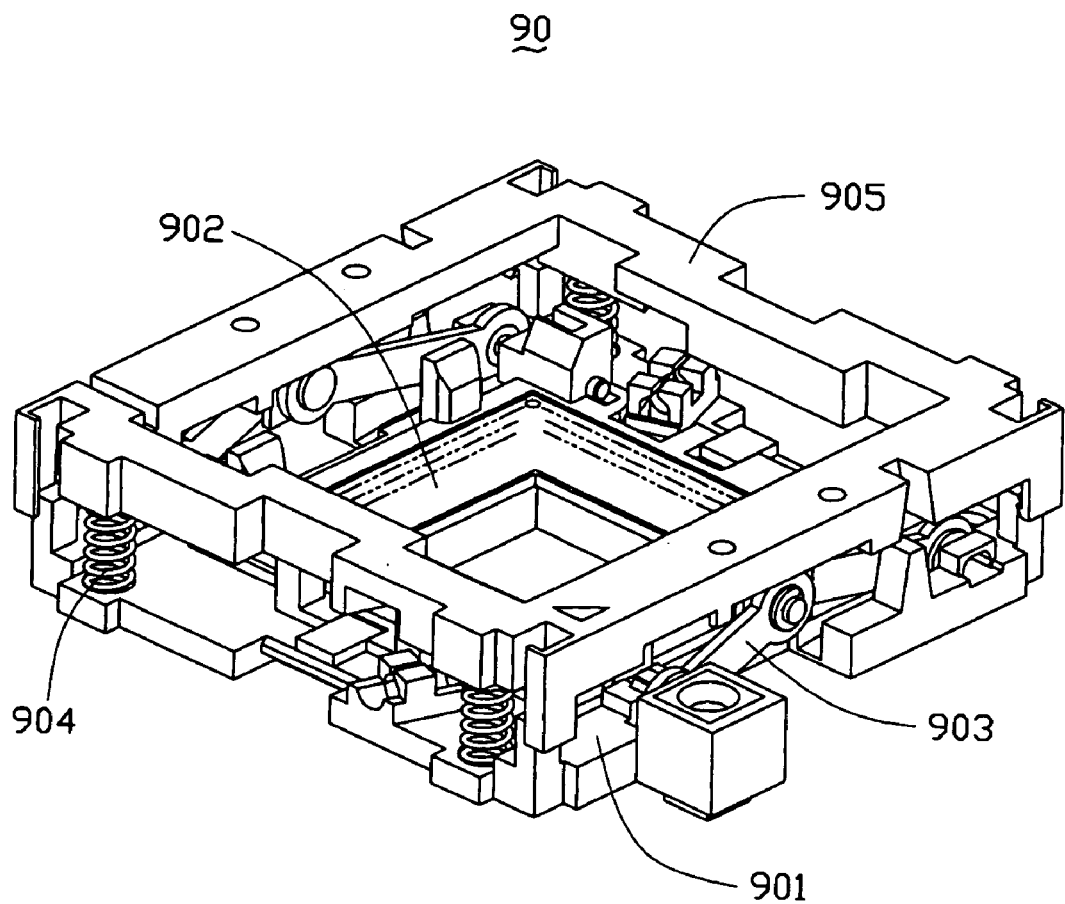
FIG. 5 is a simplified, exploded isometric view of a test connector of said co-pending U.S. patent application Ser. No. 10/455,921.

Referring to FIGS. 3 and 4, in assembly, the PCB module 30 is mounted on the supporting plate 60. The IC package 40 is received in the test connector 14, and the test connector 14 is mounted on the PCB module 30. The columns 160 of the supporting member 16 are placed on the PCB module 30, and the frame 162 is placed on the columns 160. The screws 80 are extended through the stepped holes 1626 of the frame 162, the first through holes 1602 of the columns 160 and the mounting holes 32 of the PCB module 30, and engaged in the first threaded holes 62 of the supporting plate 60. The supporting member 16 is thus fastened on the PCB module 30, with the test connector 14 being disposed between the supporting member 16 and the PCB module 30. Then, the second cams 122 of the actuation system 12 are received in the opening 1620 of the frame 162. The spindles 126 are partly received in the receiving holes 1623 of the frame 162, respectively. The first cams 120 of the actuation system 12 are received in the channels 1622 of the frame 162 respectively. The spindles 126 are pushed through the axle holes 1204 of the first cams 120, and the washers 128 are engaged in the annulus grooves 1260 of the spindles 126. The first cams 120 are thus mounted to the spindles 126, and are positioned on the lid 140 of the test connector 14. The heat sink 20 is mounted on the IC package 40 through the opening 1620 of the frame 162. The second cams 122 of the actuation system 12 are engaged with bottom faces of the connection portion 24 of the heat sink 20. The pressing member 82 is mounted on the frame 162 of the supporting member 16, with the bolts 70 being extended through the second through holes 8220 and engaged in the second threaded holes 1624. The coil springs 50 are thus disposed between the heat sink 20 and the pressing member 82.

As seen in FIG. 3, in use, the actuation system 12 is oriented to a first position. In the first position, the first lever arms 1240 of the actuation lever 124 are in the broad portions 1628 of the frame 162 and abut against the second ends 1629, and the first and second cams 120, 122 are in respective first positions. The planar portions 1222 of the second cams 122 are at respective lowest positions. The circular portions 1220 of the second cams 122 are at respective highest positions, in which they abut against the bottom faces of the connection portion 24 of the heat sink 20. The coil springs 50 between the heat sink 40 and the pressing member 82 are in a compressed state, with the heat sink 20 at a highest position disengaged from the IC package 40. The recessed portions 1202 of the first cams 120 are at respective lowest positions, so that the actuation system 12 applies no force on the lid 140 of the test connector 14. Thus the test connector 14 is in a first position, with the lid 140 thereof at a highest position, and the cover 142 thereof in the open position. In the open position, the leads of the IC package 40 do not contact the terminals of the base 144 of the test connector 14.

As seen in FIG. 4, the actuation system 12 is then rotated to a second position. In the second position, the first lever arms 1240 of the actuation lever 124 are in the narrow portions 1627 of the frame 162 and abut against the first ends 1625, and the first and second cams 120, 122 are in respective second positions. The circular portions 1220 of the second cams 122 are at respective lowest positions. The planar portions 1222 of the second cams 122 are at respective highest positions, in which they are engaged with the bottom faces of the connection portion 24 of the heat sink 20. Accordingly, the actuation system 12 is retained in the second position. The coil springs 50 between the heat sink 40 and the pressing member 82 are decompressed, thereby driving the heat sink 20 downwardly so that the heat sink 20 abuts against the IC package 40. The recessed portions 1202 of the first cams 120 are at respective highest positions, so that the actuation system 12 applies force on the lid 140 of the test connector 14. Thus, the test connector 14 is moved to a second position, with the lid 140 thereof moved to a lowest position, and the cover 142 thereof slid to the closed position. In the closed position, the leads of the IC package 40 are mechanically and electrically connected to the terminals of the base 144 of the test connector 14. As a result, the IC package 40 can be effectively and reliably tested.

When the actuation system 12 is moved from the first position to the second position, the heat sink 20 is disengaged from the IC package 40 until the planar portions 1222 of the second cams 122 have reached their respective highest positions. The first cams 120 exert continuous, uniform and balanced forces on the lid 140 of the test connector 14, so that the test connector 14 is steadily moved from the open position to the closed position. As described above, the test connector 14 is securely retained in the closed position, so that testing of the IC package 40 is performed reliably. In addition, the supporting plate 60 helps prevent deformation of the PCB module 30, while providing secure fastening of the supporting member 16 on the PCB module 30.

As will be appreciated from the foregoing description, the actuation system 12 permits effective testing of the IC package 40. Unlike conventional art, this is achieved without the risk of uneven force being applied on the lid 140 of the test connector 14, and without taking up extra space in the environment of the test connector 14.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electronic device testing assembly comprising:
   a printed circuit board (PCB) module;
   a supporting plate for protecting the PCB module;
   a test connector mounted on the PCB module;
   an actuation system for actuating the test connector to move from a first position to a second position;
   a supporting member mounted on the PCB module and engaged with the actuation system;
   an integrated circuit (IC) package received in the test connector;
   a heat sink mounted on the IC package; and
   a pressing member engaged with the supporting member wherein the supporting member comprises a frame and a plurality of columns for supporting the frame, each of the columns defining a through hole, wherein the frame defines an opening in a center therefor, a pair of opposite channels next to the opening, a plurality of stepped holes corresponding to the mounting holes of the PCB module respectively, and a pair of spaced threaded holes in each of connection walls located between the opening and the channels, a pair of receiving holes in opposite inner lateral sidewalls therefor at opposite sides of the opening in communication with the corresponding channels, wherein the actuation system comprises a pair of first cams received in the channels of the frame respectively, a pair of second cams engaged with the heat sink, a pair of spindles respectively received in the receiving holes of the frame, and an actuation lever connected between the first cams.

2. The assembly as described in claim 1, further comprising a plurality of coil springs received between the heat sink and the pressing member.

3. The assembly as described in claim 1, wherein each of the spindles is integrally formed with a corresponding one of the second cams as a single piece, and each of the first cams is mount to the corresponding spindle.

4. The assembly as described in claim 1, wherein the pressing member is generally "I"-shaped, and comprises a pair of end portions each having a pair of spaced through holes corresponding to the threaded holes of the frame respectively, and a middle portion interconnecting the end portions.

5. The assembly as described in claim 1, wherein the PCB module is mounted on the supporting plate, and defines a plurality of mounting holes.

6. The assembly as described in claim 5, wherein the supporting plate defines a plurality of threaded holes corresponding to the mounting holes of the PCB module respectively.

7. The assembly as described in claim 1, wherein the heat sink is received in the opening of the frame, and comprises a plurality of fins and a connection portion.

8. The assembly as described in claim 7, wherein the connection portion of the heat sink defines a plurality of blind holes for receiving the coil springs respectively.

9. A connector assembly for burn-in testing of an integrated circuit (IC) package, the connector assembly comprising:
a test connector comprising a base with a plurality of terminals therein, a cover movably mounted on the base, a lid engaged with the base, and a pair of operating members engaged with the base and the cover;
an actuation system for actuating the lid of the test connector to move upwardly and downwardly; and
a supporting member engaged with the actuation system; wherein
when the actuation system is oriented at a first position, the lid is located in an upper limit position with the cover in an open position in which leads of the IC package do not contact the terminals in the base, while when the actuation system is rotated to a second position, the lid is moved downwardly to a lower limit position with the cover being moved to a closed position in which the IC package is mechanically and electrically connected to the terminals in the base
wherein the actuation system comprises a pair of first cams, a pair of second cams, each having a circular portion and a planar portion, an actuation lever having a pair of first lever arms and a second lever arm interconnecting the first lever arms, and a pair of spindles, wherein the supporting member comprises a frame and a plurality of columns for supporting the frame, each of the columns defining a through hole.

10. The connector assembly as described in claim 9, wherein each of the spindles is integrally formed with a corresponding one of the second cams as a single piece.

11. The connector assembly as described in claim 10, wherein each of the first cams is integrally formed with a corresponding one of the first lever arms as a single piece, a width of the first lever arm being equal to a width of the first cam.

12. The connector assembly as described in claim 11, wherein each of the first cams has a recessed portion near the first lever arm, the recessed portion defining an axle hole in a center thereof.

13. The connector assembly as described in claim 12, wherein the spindle defines a groove in one end thereof, and has a planar portion formed along circumferential periphery thereof.

14. The connector assembly as described in claim 13, wherein the first cam is mounted to the spindle through the axle hole of the first cam, and a fastener is received in the groove of the spindle for preventing the corresponding first cam from disconnecting from the spindle.

15. The connector assembly as described in claim 9, wherein the frame defines an opening in a center thereof, a pair of opposite channels next to the opening, a plurality of stepped holes corresponding to the through holes of the columns respectively, and a pair of receiving holes for receiving the spindles of the actuation system.

16. The connector assembly as described in claim 15, wherein the first cams of the actuation system are received in the corresponding the channels of the frame, and the second cams are received in the opening of the frame.

17. The connector assembly as described in claim 16, wherein when the actuation system is located in the first position, the circular portions of the second cams abut against a heat sink, while when the actuation system is located in the second position, the planar portions of the second cams abut against the heat sink.

18. The connector assembly as described in claim 17, wherein a pressing member is mounted on the supporting member, and a plurality of coil springs is positioned between the heat sink and the pressing member.

19. The connector assembly as described in claim 18, wherein when the actuation system is located in the first position, the heat sink is disconnected from the IC package, while when the actuation system is located in the second position, the heat sink abuts against the IC package.

20. An actuation mechanism of a test connector mounted on a printed circuit board (PCB) module, the actuation mechanism comprising:
a supporting member mounted on the PCB module, the supporting member comprising a frame and a plurality of columns for supporting the frame; and
an actuation system engaged with the supporting member, the actuation system comprising a pair of first cams, a pair of second cams, a pair of spindles engaged with the second cams, and an actuation lever engaged with the first cams
wherein the frame defines an opening in a center therefor, a pair of opposite channels next to the opening, and a plurality of stepped holes arranged in a rectangular formation, wherein a pair of receiving holes is defined in opposite inner lateral sidewalls of the frame at opposite sides of the opening of the frame, the receiving holes being in communication received in the receiving holes of the frame, and the first cams of the actuation system are received in the channel of the frame.

21. The actuation mechanism described in the claim 20, wherein each of the spindles is integrally formed with a corresponding one of the second cams are as a single piece.

22. The actuation mechanism described in the claim 20, wherein the actuation lever comprises a pair of first lever arms and a second lever arm interconnecting the first lever arms.

23. The actuation mechanism described in the claim 22, wherein each of the first cams is integrally formed with a corresponding one of the first lever arms as a single piece, a width of the first lever arm being equal to a width of the first cam.

24. The actuation mechanism described in the claim 23, wherein the first cam is substantially circular, and has a recessed portion near the first lever arm.

25. The actuation mechanism as described in claim 24, wherein an axle hole is defined in a center of the recessed portion of the first cam for mounting the first cam to the spindle.

26. The actuation mechanism as described in claim 25, wherein the spindle defines a groove in one end thereof and has a planar portion, a fastener being received in the groove for preventing the first cam from disengaging from the spindle.

27. The actuation mechanism as described in claim 26, wherein each of the second cams comprises a circular portion and a planar portion.

28. The actuation mechanism as described in claim 20, wherein an IC package is received in the test connector, and a heat sink is received in the opening of the frame and mounted on the IC package.

29. The actuation mechanism as described in claim 28, wherein a pressing member is mounted on the supporting member, and a plurality of coil springs is located between the pressing member and the heat sink.

30. The actuation mechanism as described in claim 29, wherein when the actuation system is oriented at a first position, the circular portions of the second cams abut against the heat sink and the heat sink is disconnected from the IC package, while when the actuation system is rotated at a second position, the planar portions of the second cams abut against the heat sink and the heat sink is in contact with the IC package.

\* \* \* \* \*